United States Patent
Vest et al.

(10) Patent No.: US 6,242,941 B1
(45) Date of Patent: Jun. 5, 2001

(54) REDUCING I/O NOISE WHEN LEAVING PROGRAMMING MODE

(75) Inventors: W. Bradley Vest, Santa Clara; Mark W. Fiester, Redwood City; Myron W. Wong, Fremont; John C. Costello, San Jose; Robert R. N. Bielby, Pleasanton; Krishna Rangasayee, Sunnyvale, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/320,858

(22) Filed: May 26, 1999

Related U.S. Application Data

(60) Provisional application No. 60/087,193, filed on May 29, 1998.

(51) Int. Cl.$^7$ .................................................. H03K 17/16
(52) U.S. Cl. ............................ 326/26; 326/27; 326/83; 326/87; 327/384
(58) Field of Search ...................... 326/26, 27, 37–40, 326/44, 56, 57, 83, 87; 327/403, 404, 384

(56) References Cited

U.S. PATENT DOCUMENTS

| | | | |
|---|---|---|---|
| 4,879,688 | * | 11/1989 | Turner et al. ........................ 326/38 |
| 5,229,657 | * | 7/1993 | Rackley ................................ 326/86 |
| 5,764,074 | * | 6/1998 | Wykes et al. ........................ 326/27 |
| 6,087,870 | * | 7/2000 | Sakamoto ............................ 327/176 |

* cited by examiner

Primary Examiner—Son Mai
(74) Attorney, Agent, or Firm—Townsend and Townsend and Crew LLP

(57) ABSTRACT

An integrated circuit contains circuitry to operate in such a fashion to reduce output noise when switching output circuits from a programming mode to a user mode. In an implementation, the integrated circuit (125) is configurable in the programming mode with user configuration data. In the user mode, the integrated circuit will operate with the functionality as defined by the user during the programming mode. When switching from the programming mode to the user mode, each output (210) of the integrated circuit will switch to its user mode value. In order to minimize switching noise, the outputs are released to their user mode values not all at the same time.

46 Claims, 8 Drawing Sheets

REDUCING I/O NOISE WHEN LEAVING PROGRAMMING MODE

CROSS-REFERENCES TO RELATED APPLICATIONS

This application claims the benefit of U.S. provisional application 60/087,193, filed May 29, 1998, which is, along with all the other references named in this application, incorporated by reference in their entirety for all purposes.

BACKGROUND OF THE INVENTION

The present invention relates generally to integrated circuits and more specifically to techniques and circuitry for reducing or preventing output noise for integrated circuits.

Integrated circuits (ICs) or "chips" are the building blocks of electronic systems. Electronics are used in many applications such as computers, networking, telecommunications, electronic commerce, and the internet. Some examples of electronic systems include computers, workstations, servers, telephone networks, automotive electronic ignition, network, and many others. In a system, there are many potential sources of noise. As an example, an integrated circuit generates noise when its outputs switch. Even more noise is generated when many outputs of one or more integrated circuits switch at the same time. There are many other sources of noise such as cross-coupling noise from signals propagating through the traces of a printed circuit (PC) board, RF noise or interference, or poor grounding.

It is desirable to minimize the amount of noise generated in a system. Depending on the severity, electronic noise may lead to logic errors in a system or even worse, cause the entire system to stop functioning. For example, the noise may lead to errors when handling an electronic commerce transaction. The noise may cause a computer system to crash. The noise from one integrated circuit may cause another integrated circuit in the system to malfunction.

As can be appreciated, there is a need for techniques and circuitry to reduce or prevent the noise in an integrated circuit.

SUMMARY OF THE INVENTION

The present invention provides techniques and circuitry for operating an integrated circuit to reduce noise when switching output circuits from a programming mode to a user mode. An integrated circuit such as a programmable integrated circuit is configurable in the programming mode with user configuration data. In the user or normal mode, the integrated circuit will operate with the functionality as defined by the user during the programming mode. When switching from the programming mode to the user mode, each output of the integrated circuit will switch to its user mode value. In the present invention, the outputs are released to their user mode values not all at the same time in order to minimize switching noise. In a particular implementation, the outputs of the integrated circuit are individually and sequentially returned to their user mode values one at a time. There is a delay period between one output circuit returning to its user mode and another output circuit.

One embodiment of the present invention is a method of operating an integrated circuit where in a programming mode, the I/O pins of the integrated circuit in a user-defined or high impedance state. The I/O pins are kept in the user-defined or high impedance state when exiting the programming mode. Each I/O pin of the I/O pins is released for user mode operation. There is a delay period between the release of each I/O pin. User mode operation is permitted after the plurality of I/O pins is released. Furthermore, an output driver driving each I/O pin may have a slow slew rate mode, and when switching from the programming mode to the user mode operation, the output driver drives its pin to its user mode value using the slow slew rate mode. User mode operation is permitted after releasing the output drivers coupled to the I/O pins to a user-defined slew rate mode. In the programming mode, when each I/O pin tristates or in a high impedance state, there may be a leaker device to hold the pad at a logic high state.

In another embodiment, the present invention is an integrated circuit including a first output circuit to drive a first I/O pin, and a second output circuit to drive a second I/O pin. A delay element is connected between the first and second output circuit. When exiting a programming mode of the integrated circuit, the second output circuit is released to its user mode state after the first output circuit is released to its user mode state after a delay time. This delay time is determined by the delay element. In the programming mode, the first and second output circuits may provide a high impedance or user-defined state at the first and second I/O pins. Noise at the first I/O pin and second I/O pin is reduced by releasing the first and second output circuits at different times.

Other objects, features, and advantages of the present invention will become apparent upon consideration of the following detailed description and the accompanying drawings, in which like reference designations represent like features throughout the figures.

DETAILED DESCRIPTION

There are many type of integrated circuit such as microprocessors, memories, programmable logic, gate arrays, and ASICs. It is desirable to reduce noise for all types of integrated circuits, and the techniques and circuitry of the present invention are applicable to all types of integrated circuits. This description, however, discusses specific implementations in the area of programmable logic in order to illustrate the invention.

Configurable or programmable integrated circuits such as programmable logic devices (PLD) or field programmable gate arrays (FPGA) are configurable by a user to implement the user's desired functions. Integrated circuits are also commonly referred to as "chips." For example, the programmable integrated circuit may be configured to implement a microprocessor, memory, or specialized logic for an application-specific purpose. A more detailed discussion of programmable devices and techniques for configuring them is found in Altera Corporation's 1998 *Altera Data Book*, January 1998, which is incorporated by reference. Programmable devices are discussed in U.S. Pat. Nos. 4,617,479, 4,871,930, 5,241,224, 5,258,668, 5,260,610, 5,260,611, and 5,436,575 5,550,782, 5,570,040, 5,572,148, 5,590,305, and 5,869,979, which are incorporated by reference.

A programmable integrated circuit typically has a user mode and a programming mode. The user mode is a mode in which the user may exercise the functionality configured into the programmable integrated circuit during the programming mode. In the programming mode, the user may configure the programmable integrated circuit to implement the desired functionality. There are various techniques for configuring a programmable integrated circuit such as by programming on-chip EEPROM or Flash cells or loading configuration from a configuration source like a serial EPROM (see U.S. Pat. No. 5,590,305). This programmable integrated circuit may be configured by in-system programming (ISP). ISP mode means the integrated circuit is configured while it is resident in a system, such as on printed circuit (PC) board.

Figure 1:
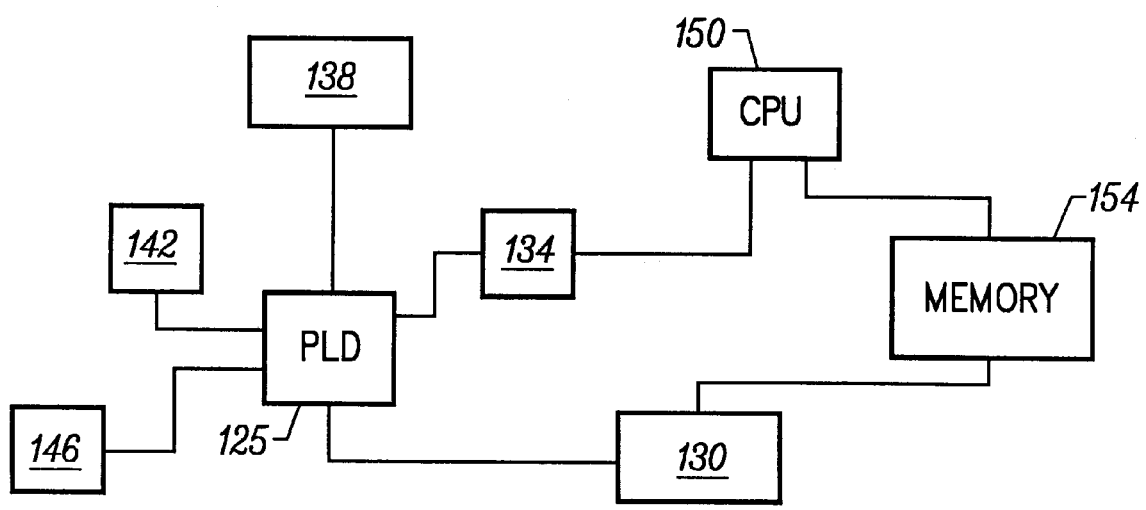
FIG. 1 shows an electronic system with various integrated circuits, including a programmable integrated circuit.

FIG. 1 shows a electronic system with various integrated circuits including PLD 125. The PLD is connected to various other integrated circuits 130, 134, 138, 142, and 146. Each of these integrated circuits may be one of the many types of integrated circuit including memory, logic, and processor. For example, a CPU or microprocessor 150 is coupled to a memory 154. For ISP programming, the PLD will be configured while it is on the PC board; the PLD will remain connected to the other electronic components during programming. The PLD will be configured with configuration data, and this configuration may be from a nonvolatile source such as a EPROM 146. The PLD may be partially or fully configured during programming. For example, if the PLD is used as a reconfigurable processor, the PLD will be partially reconfigured during system operation so the PLD will be able to perform some specialized logical functions very quickly. After the PLD programmed, the PLD is placed back into the user mode in order to use the device.

Potential problems may occur when changing from the programming mode to the user mode. In a first implementation, during the programming mode, the integrated circuit's I/Os (e.g., pins) are tristated. When tristated, the I/Os will generally not interfere with other integrated circuits to which the programmable integrated circuit is connected. This is an important consideration for ISP programming.

In a second implementation, during the programming mode, the I/Os will be in a state logic high, logic low, or tristate, as set by the user. For example, the user may specify the logic state for each I/O by using a boundary scan path. This technique, among others, is described in U.S. Pat. No. 5,869,979. The second implementation may be referred to as the boundary scan data mode. This second implementation of the programming mode allows greater flexibility for control of the I/Os during programming. It is useful for ISP programming because for example, some I/Os may be connected to inputs of other integrated circuits. In such a situation, it would generally be undesirable to tristate the I/Os during the programming mode. The user could instead use the boundary scan or test mode circuitry to set the I/O to be high or low.

In a third implementation, the programming mode may operate as a combination of the first and second implementations discussed above, at the user's option. In this implementation, the programmable integrated circuit would be compatible with designs using either programmable integrated circuits having either the first or second programming mode implementation. This provides backward compatibility with previous generation designs.

Noise may occur when switching from the programming mode to the user mode in any of the above implementations. In the user mode, the I/Os may be logic high, logic low, or tristate, depending on the logic configured in the programmable integrated circuit. When changing from the programming mode to the user mode, or vice versa, I/Os will transition from their programming mode state to their user mode state. This will cause noise since many pins are changing states at the same time. The noise may result in ground bounce, power supply bounce, output ringing, and edge transition slowdown, as well as other types of noise phenomena. Typical programmable integrated circuits have many I/O pins such as 32, 64, 96, 160, or 208 or more. It is desirable to reduce the noise from switching from the programming mode to the user mode, or vice versa, to reduce the potential for logic and other problems due to the switching noise.

The present invention allows for a transition from the programming mode to the user mode in such a fashion that the chip I/Os change from tristate or user-specified state to their user mode state in a controlled manner. This will prevent noise and glitches that could be caused from all outputs being released to their user mode state concurrently.

Figure 2:
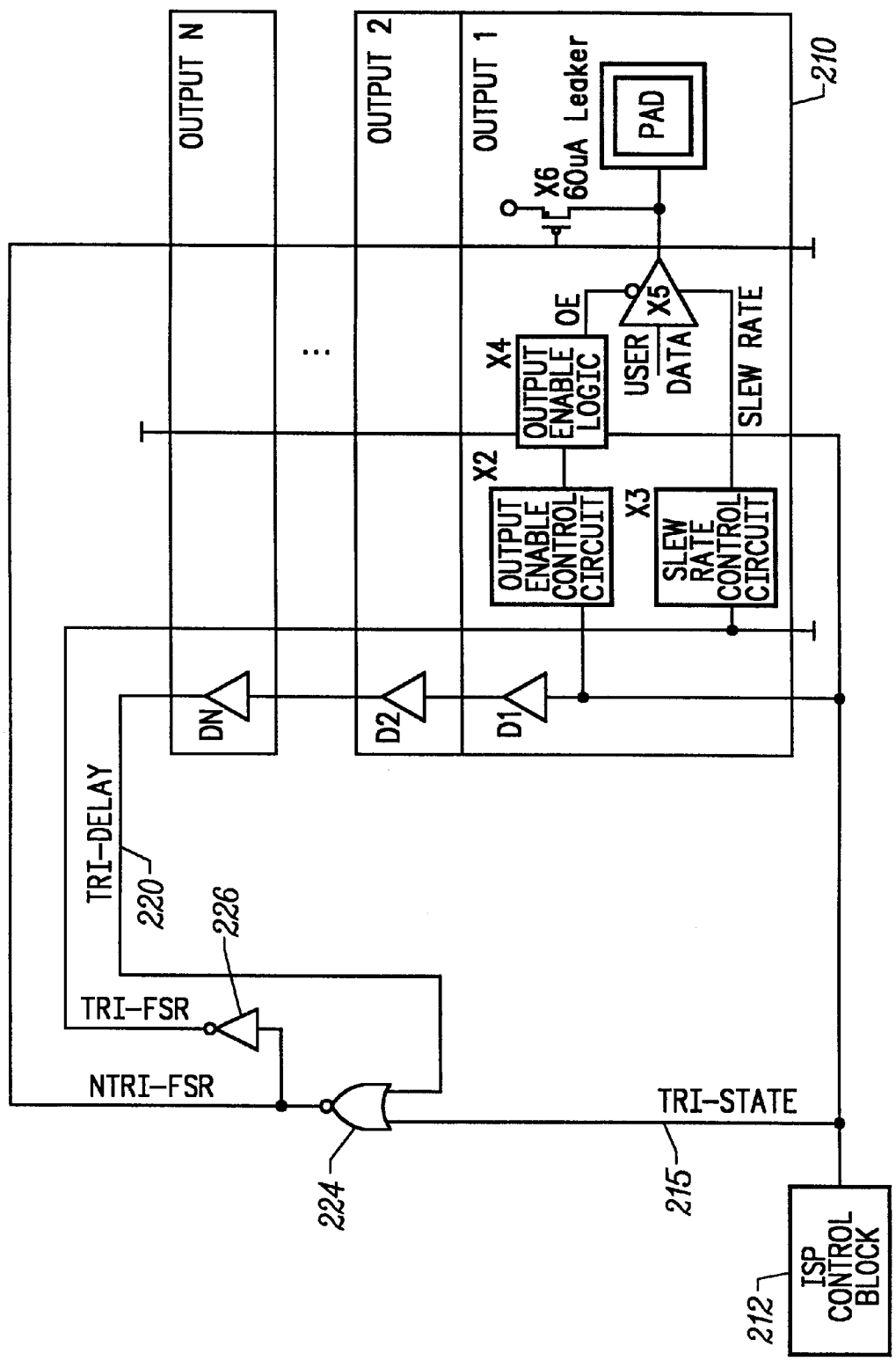
FIG. 2 shows a block diagram of an integrated circuit where in a programming mode, the outputs are placed in a high impedance state.

FIG. 2 shows an overview of the circuitry of the present invention. This figure shows circuitry for a programming mode implementation where the I/Os will be tristated (i.e., the first programming mode implementation discussed above). There are outputs 1 to N, where N is any integer number representing the number of output circuits (or macrocells) of the integrated circuit. Each output will have circuitry similar to what shown for output 1 210. Output 1 has an output enable (OE) control circuit X2, slew rate control X3, OE logic X4, output buffer X5, delay element Dn, leaker device X6, and pad.

Output buffer X5 is connected to user data, which is the internal data path of the integrated circuit. Data from the user data path will be output to the pad during the user mode.

An ISP control block 212 generates a tristate signal 215. This signal is high during the programming mode and low during the user mode. Upon entering the programming or ISP mode, the tristate signal will transition from low to high. The tristate signal is connected to control OE logic X4, which will tristate output buffer X5 during the programming mode. In this implementation, OE logic X4 generates an OE signal. When OE is low, output buffer XS is enabled, and disabled when OE is high.

Tristate signal 215 is also connected to a delay chain formed by the delay elements in the output circuits. The last delay element of the chain Dn generates a tridelay signal 220. In this implementation, the tridelay signal is a signal of the same polarity as tristate signal 215. The total delay of the chain, from input of the first delay element D1 through the last delay element Dn, will be the sum of the delays of the individual delay elements. Delay element D1 to Dn may be implemented using any of the techniques used to make delay circuits such as by using inverters, resistances, capacitances, and impedances. In a specific embodiment, the delay of a delay element Dn is about 1 nanosecond. The total delay is less than about 100 nanoseconds depending on the number of I/O pins.

Tristate signal 215 and tridelay signal 220 are connected to a logic gate 224. Logic gate 224 is a NOR gate, but the logic may be implemented using other logic gates including NAND, AND, and OR gates. Outputs from of logic gate 224 (and an inverter 226) are NTRI_FSR and TRI_FSR, which are complements of each other. TRIFSR is connected to slew rate control circuit X3. NTRI_FSR is connected to leaker device X6. TRI_FSR will be low when either tristate 215 or tridelay 220, or both, is low. When tristate 215 and tridelay 220 are both low, TRI_FSR will be high.

Also when entering the programming mode, slew rate control circuit X3 associated with each macrocell causes each output buffer X5 to enter and operate in a slow slew rate mode. Slew rate circuit X3 enables slow slew rate mode when TRI_FSR goes high. In a specific embodiment, the output buffer X5 is designed to have a fast slew rate mode and a slow slew rate mode. Output buffer X5 will have more rapid transitions in the fast slew rate mode than the slow slew rate mode. Since an edge rate of the output buffer will be slower in the slow slew rate mode, this will result in less noise. Having an output buffer with normal and slow slew rate modes is an option of the present invention. Other aspects of the present invention will reduce noise for any output buffer implementation, even when single slew rate output buffers are used.

A leaker device X6 will also be enabled upon entering the programming mode. In this specific embodiment, X6 is a PMOS device. However, depending on the target VOH level at the pad, an NMOS or other device may be used. Leaker device X6 may have a leakage current of about 60 microamps. Other leakage currents may also be used such a current less than 1 microamp, from 1 microamp to 10 microamps, from 10 microamps to 30 microamps, from 30 microamps to 60 microamps, or more than 60 microamps. The leaker device provides a relatively weak pull-up current to a logic high level at the pad when the output buffer is tristated. This ensures the programmable integrated circuit will drive other integrated circuits with a valid logic level during the programming mode. The leakage current should be relatively small so if an I/O is shorted to ground or another voltage, the leakage current will cause no damage to other components.

A leaker device is optional. Without a leaker device, the circuitry would still operate and provide the reduced I/O noise benefits as discussed above. However, when in the programming mode, without a leaker device the outputs would not be held to a logic high or other level. The outputs would be instead in a high impedance state. A leaker device may also be used to hold the output at voltage or logic levels other than a logic high. The leaker device can be connected between the pin and any fixed voltage level, including ground and voltages between ground and VDD. The leaker device may hold the pin at a logic low rather than a logic high.

Upon exiting the programming or ISP mode, tristate signal 215 will go low, enabling OE logic X4. However, immediately after tristate signal 215 goes low, a set of OE architecture bits will still be configured to tristate, overriding their user-programmed state. So, the outputs remain in a tristate or high impedance state. Tristate signal 215 is coupled to OE control X2 to release these architecture bits to their user-programmed state. But, the architecture bits for their respective outputs will be released in a sequentially delayed fashion, one output at a time. Output 1 is released to its user-programmed state, then output 2, and so forth. Output N will be the last output to return to its user-programmed state. This occurs because each of the delay buffers Dn provides a delay before releasing the next output in the series. This minimizes noise and unwanted glitches since the multiple outputs will not be switching to their user-programmed state at exactly the same time.

Moreover, the slew rate bit will not be released until TRI_FSR goes low, which occurs when both tristate signal 215 and tridelay signal 220 are both low. Tridelay signal 220 goes low after the tristate signal propagates through the entire delay chain D1 to Dn. Therefore, in this implementation, the outputs will switch to their user value slowly. This further reduces potential noise and unwanted glitches. After all the outputs have been returned to their user-programmed state, slew rate control circuit X3 is released to its user value. The output buffers will be placed into a fast slew rate mode or slow slew rate mode, depending on which mode the user has configured the output buffer to operate in during the user mode. Also, when TRI_FSR is low, NTRIFSR is high. This turns off leaker device X6.

Therefore, using this technique of the present invention, the outputs of the integrated circuit are switched from the programming mode to the user mode in a fashion to minimize noise glitches.

Figure 3A:
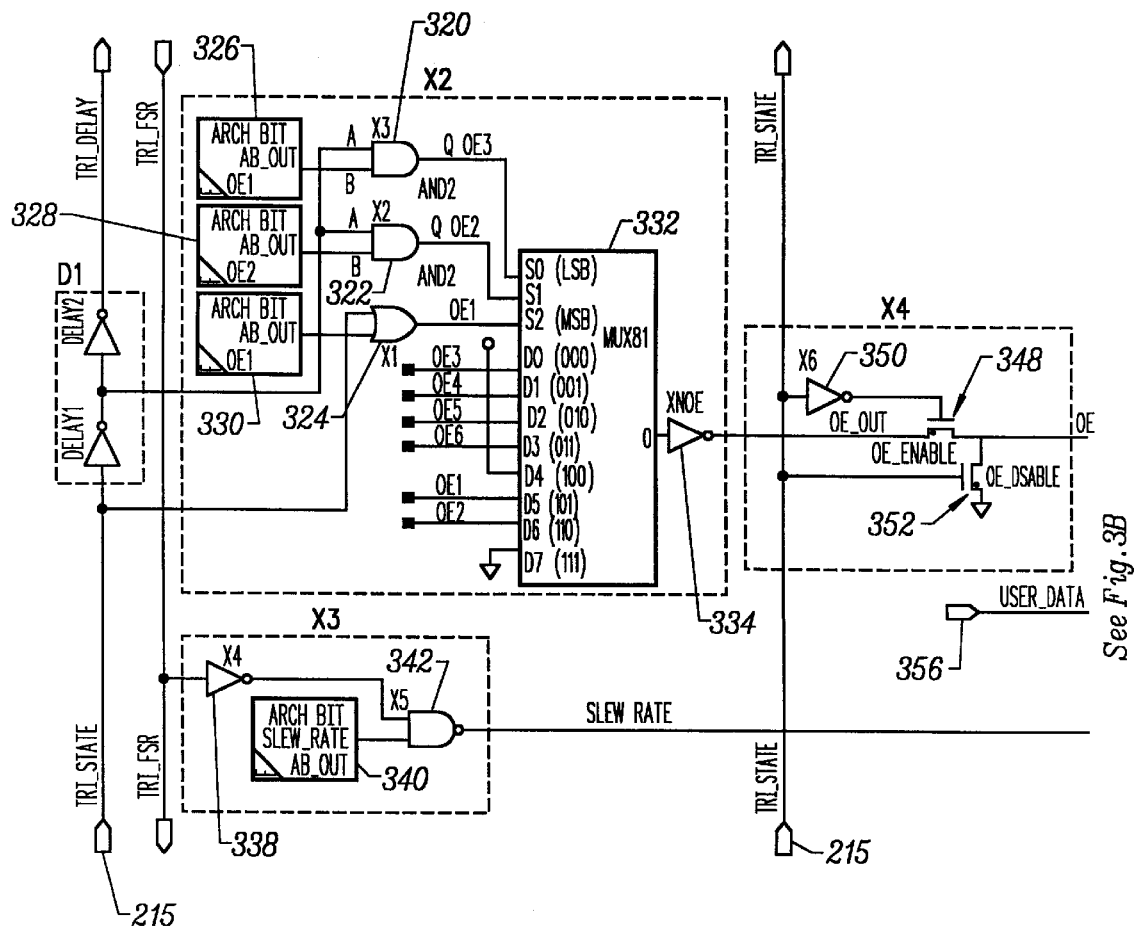
FIG. 3 shows a specific circuit implementation of the integrated circuit of FIG. 2.
Figure 3B:
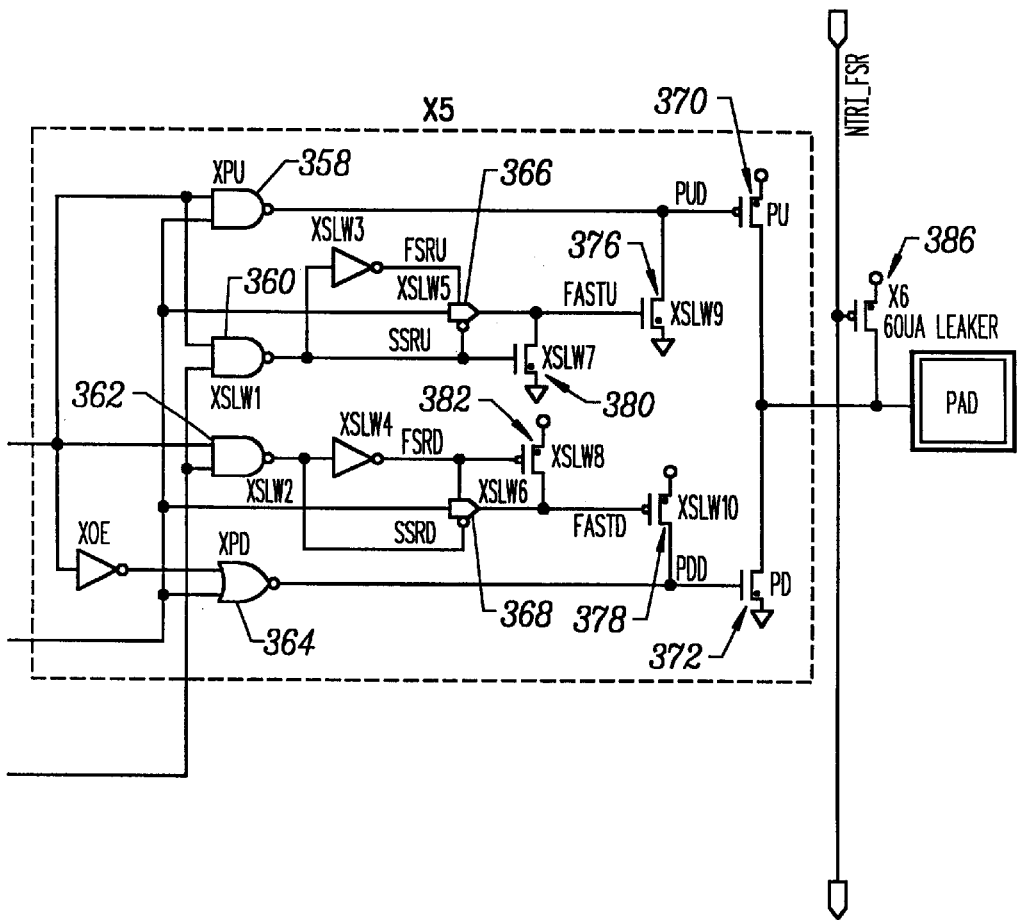

FIG. 3 is a more detailed diagram showing a specific implementation for the Output 1 circuitry of FIG. 2. The circuitry is repeated N times. Box D1 shows the delay element D1. Box X2 shows the output enable control circuit. Box X3 shows the slew rate control circuit. Box X4 shows the output enable logic. Box X5 shows the output buffer circuit.

Delay element D1 is implemented using two inverters. In output enable control circuit X2, there are three logic gates, AND gate 320, AND gate 322, and OR gate 324. There are many different, but equivalent ways to implement the same logic function using different logic gates and different connections. In this specific case, tristate signal 215 is connected to OR gates 324. An output of the first inverter in the delay element D1 is connected to both AND gates 320 and 322.

There are three output enable architecture bits 326, 328, 330, which are memory cells that hold the user-defined state for output enable and output enable control. Architecture bits 326, 328, and 330 correspond to OE3, OE2, and OEI. There are other architecture bits on the integrated circuit that control other features of the integrated circuit. Architecture bits can be implemented in any memory or user-definable technology such as EPROM, EEPROM, Flash, antifuse, laser-programmed fuses, DRAM, SRAM, register, flip-flop, mask-definable option, and many others. Output enable architecture bits 326, 328, and 330 are connected to gates 320, 322, and 324, respectively.

The circuitry includes a multiplexer 332 having selection inputs S0 to S2 and data inputs D0 to D7. The output of gates 320, 322, and 324 are connected to selection inputs S0, S1, and S2, respectively. Data input D0 is connected to user OE3. Data input D1 is connected to user OE4. Data input D2 is connected to user OE5. Data input D3 is connected to user OE6. Data input D4 is connected to VDD. Data input D5 is connected to user OE1. Data input D6 is connected to user OE2. Data input D7 is connected to ground. Multiplexer 332 outputs through an inverter 334, which is the output of output enable control circuit X2.

User OE1 to OE6 are user mode output enable control signals. These signals are logic signals from pins or the logic blocks on the integrated circuit. The user uses these signals to control whether the I/Os are tristated during the user mode.

During normal operation, the output of multiplexer 332 will be the output enable control according to the user-defined architecture bits. However, during programming mode, when tristate signal 215 is high, multiplexer 332 will select to output VDD (i.e., D4). This is because the outputs of gates 320, 322, and 324 will be 0, 0, and 1, respectively, which indicates to the multiplexer to select input D4. Therefore, the output of circuit X2 will be a logic low, which disables the output buffer circuit.

Slew rate control circuit X3 includes an inverter 338 and slew rate architecture bit 340 connected to an input of a NAND gate 342. Inverter 338 is connected to TRI_FSR. NAND gate 342 outputs the SLEW_RATE signal to the output buffer circuit X5. As described above, based on the state of TRI_FSR, the output buffer may placed in the slow slew rate state overriding the user-defined setting held by architecture bit 340.

Output enable logic X4 includes a pass gate 348 coupling the output enable control circuit X2 to the output buffer circuit X5. Tristate signal 215 is connected to an inverter 350 to a gate of pass gate 348, which will control whether the X2 and X5 circuits are coupled together or not. A transistor 352 is connected between an output of X4 and ground and is controlled by tristate signal 215. When tristate signal 215 is high, blocks X2 and X5 are decoupled, and the output of X4 will be low. This will cause the output buffer circuit X5 to be in tristate. The pad will be tristated or in the high impedance state.

Output buffer circuit X5 is an output buffer that provides a slow slew rate option. An example of a low noise output buffer that may be used in this invention is described in U.S. patent application Ser. No. 09/092,240, which is incorporated by reference. User data is input via a user data input pin 356. User data input 356 is connected to a NAND gate 358 a NOR gate 364. The output of X4 is connected to NAND gates 358 and 362, and through an inverter to NOR gate 364. The output of X3 is connected to NAND gates 360 and 362.

User data input 356 is also connected to pass gates 366 and 368. Pass gates 366 are 368 are fully complementary CMOS pass gates. Fully complementary CMOS pass gates are implemented by placing connected an NMOS transistor and a PMOS transistor in parallel. The gates of these transistors are connected to complementary signals. In this case, pass gate 366 is controlled by an output of NAND gate 360, and pass gate 368 is controlled by an output of NAND gate 362.

NAND gate 358 and NOR gate 364 are predrivers connected to gates of a pull-up driver 370 and pull-down driver 372, respectively. Pull-up driver 370 is a PMOS transistor. An output buffer circuit may also have a NMOS transistor pull-up. Pull-down driver 372 is an NMOS transistor. An NMOS transistor 376 is connected between the gate of pull-up driver 370 and ground. A PMOS transistor 378 is connected between the gate of pull-down driver 372 and VDD. In the normal or fast slew rate mode, the gates of transistor 376 and 378 are driven by user date input 356. These transistors provide additional drive capability to more quickly turn on the drive transistor to which they are connected.

For example, transistor 376 provides additional pull-down current to turn pull-up transistor 370 on. This increases the pull-up speed of the output buffer. Similarly, transistor 378 provides additional pull-up current to turn pull-down transistor 372 on. This increases the pull-down speed of the output buffer.

When a slow slew rate mode is selected, pass gate 366 decouples transistor 376 from user data input 356, and a transistor 380 holds the gate of transistor 376 to ground. Pass gate 368 decouples transistor 378 from user data input 356, and a transistor 382 holds the gate of transistor 378 to VDD. Transistors 376 and 378 will be off and not provide extra drive capability. The drive to turn on or off the output drivers are solely provided by NAND gate 358 and NOR gate 364.

A leaker transistor 386 is connected between VDD and the pad. The NTRI_FSR signal is connected to the gate of leaker transistor 386.

Figure 4:
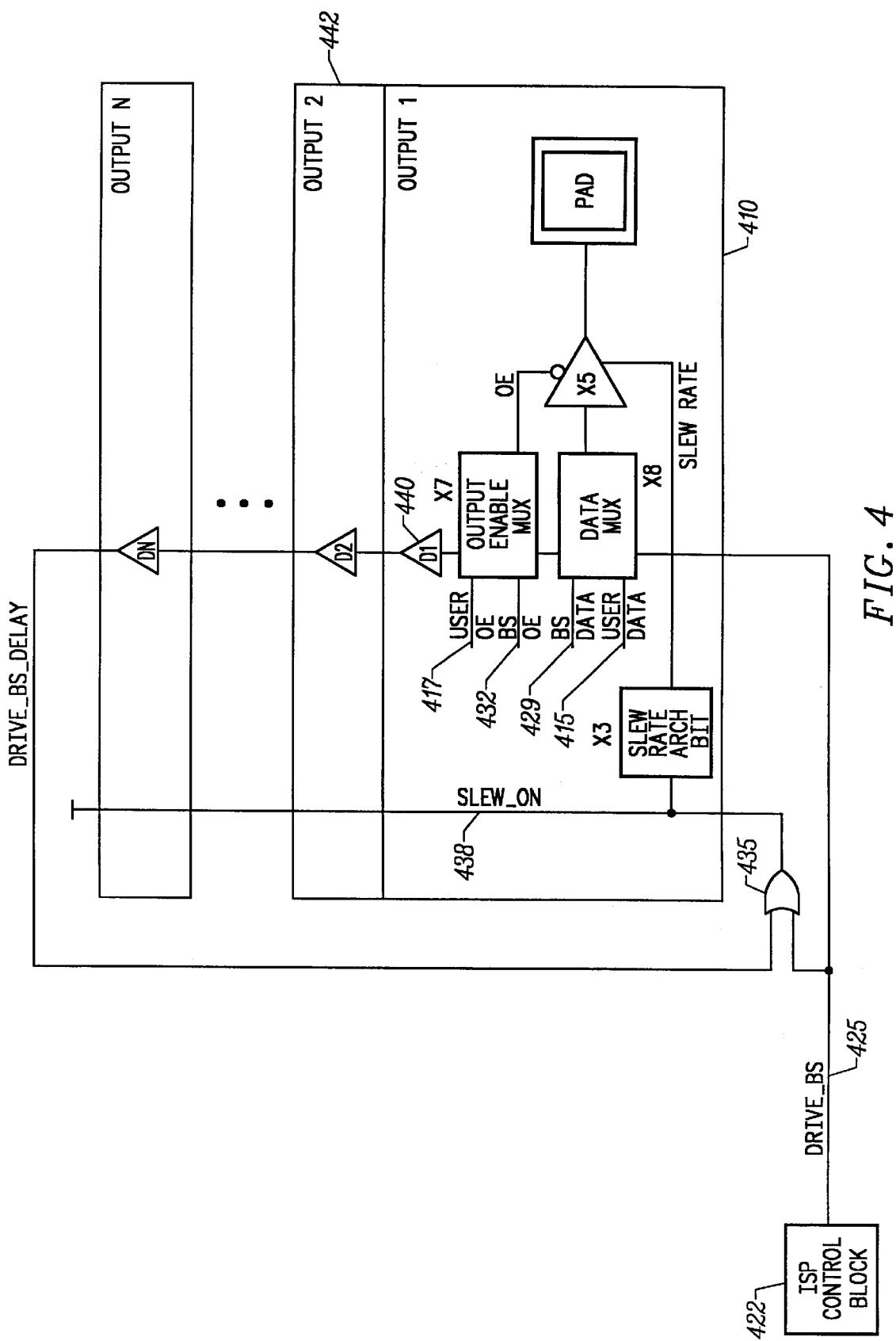
FIG. 4 shows a block diagram of an integrated circuit where in a programming mode, the outputs are placed in a user-defined state.

FIG. 4 shows a another circuit diagram for a scheme of reducing output noise when transitioning from the programming mode to the normal mode of operation. This diagram shows the second implementation of the programming mode discussed, where during the programming mode, the outputs of the integrated circuit will be placed in a state as defined by the user.

Output 1 circuit 410 shows an example of an output block, which is repeated N times. As one will note, this output circuit 410 shares has some similarities to the circuitry shown and described above for FIGS. 2 and 3. The similar aspects of the circuitry will not be discussed in detail.

ISP control block 422 generates a DRIVE_BS signal 425 that indicates to the circuitry whether the integrated circuit is in programming or normal mode. For example, DRIVE_BS is low for the normal mode and high for the programming mode. During the normal mode, based on DRIVE_BS, a user data signal 415 is connected through a data multiplexer circuit X8 to a data input of output buffer circuit X5. The user data will be output to the pad. Also during the normal mode, a user OE signal 417 will be connected through a output enable multiplexer X7 to the output buffer circuit. The user OE signal will determine whether the output buffer is enabled or tristated. When tristated, the pad will be placed in a high impedance state. The user OE signal may be provided from an architecture bit, or generated from other logic on the integrated circuit.

Output buffer circuit X5 may be similar to the circuitry described for FIG. 2. The output buffer circuit may have variable slew rates, and in particular, a slow slew rate mode. In this case, a slew rate control circuit X3 (as in FIG. 2) will control whether the output buffer circuit is in slow or normal slew rate mode. During normal operation, the output buffer will be in the slew rate mode as defined by the user.

When in programming or ISP mode, based on DRIVE_BS, a user-defined test data signal 429 (i.e., BS DATA) is connected to through data multiplexer circuit X8 to the output buffer circuit. And, a user-defined test output enable signal 432 is connected to the output enable input of output buffer circuit X5. In the programming mode, based on the user-defined test signals, the pad will be high, low, or tristated. There are various techniques for the user to define the test user and test output enable data. For example, in one implementation, this data input using the boundary scan (BS) data path of IEEE standard 1149.1 (JTAG) compliant circuitry.

Also, during the programming mode, DRIVE_BS propagates to a number of delay elements D1 to Dn to a OR gate 435. As long as DRIVE_BS is high, a SLEW_ON signal 438 will be high, and cause the slew rate control circuit X3 to force the output buffer circuit into the slow slew rate mode.

When transitioning from the programming or ISP mode to the normal mode, similar to FIG. 2, the output circuitry will be sequentially released from their user-defined test states to their normal or user mode states. Specifically, DRIVE_BS signal 425 transitions from high to low. Output 1 circuit 410 is released to its normal mode state at a slow slew rate speed. After a delay, defined by delay D1 440, the next output, output 2 circuit 442, is released to its normal mode state at a slow slew rate speed. This sequential release of the outputs occurs in turn until all outputs N are released. At that point, SLEW_ON signal 438 will become low, and the output buffer circuits will be released to their user-defined slew rate mode.

As described above, this technique of sequentially releasing the outputs at a slow slew rate speed reduces the noise when switching from the programming mode to the normal mode. Since multiple outputs are not being switched at the same time, this reduces the amount of output noise.

Figure 5:
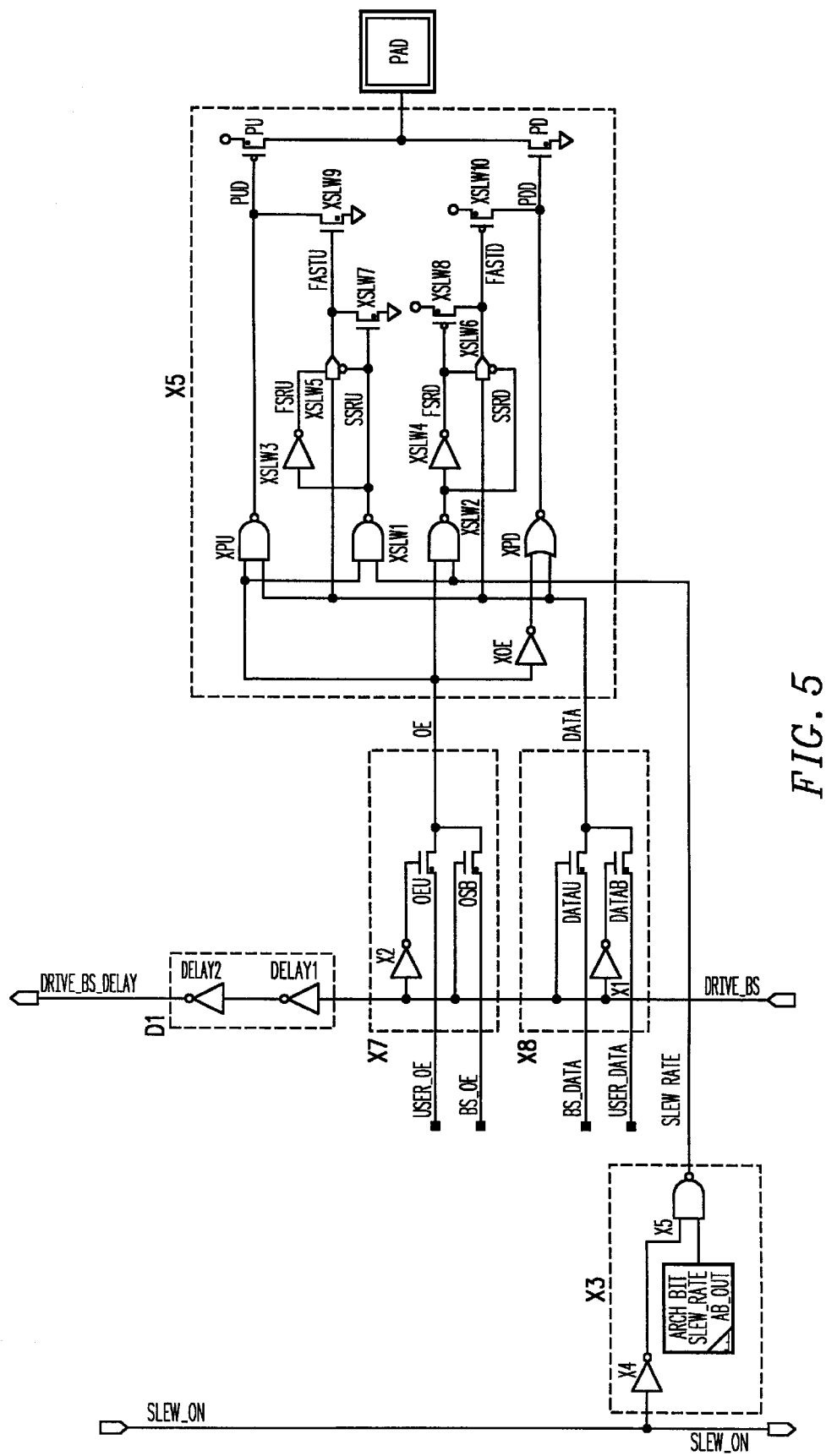
FIG. 5 shows a specific circuit implementation of the integrated circuit of FIG. 4.

FIG. 5 shows a more detailed diagram of an circuit implementation for the circuitry of FIG. 4. Output buffer circuit X5 and slew rate control circuit X3 are the same as was described for FIG. 3 above. Delay 1 circuit 440 is implemented using two inverters. The output enable multiplexer circuit X7 and data multiplexer circuit X8 are implemented using similar circuitry. These multiplexer circuits are implemented using two NMOS pass transistors. The control gates of these NMOS transistors are coupled to complementary versions of the DRIVE_BS signal to alternatively select the user data or user-defined test data. There are many other implementations of a 2-to-1 multiplexer and any of these implementations may be used for the X7 and X8 circuits. For example, fully complementary CMOS pass gates may be used in place of NMOS pass transistors. Another multiplexer implementation is to use NAND, NOR, and other types gates.

Figure 6:
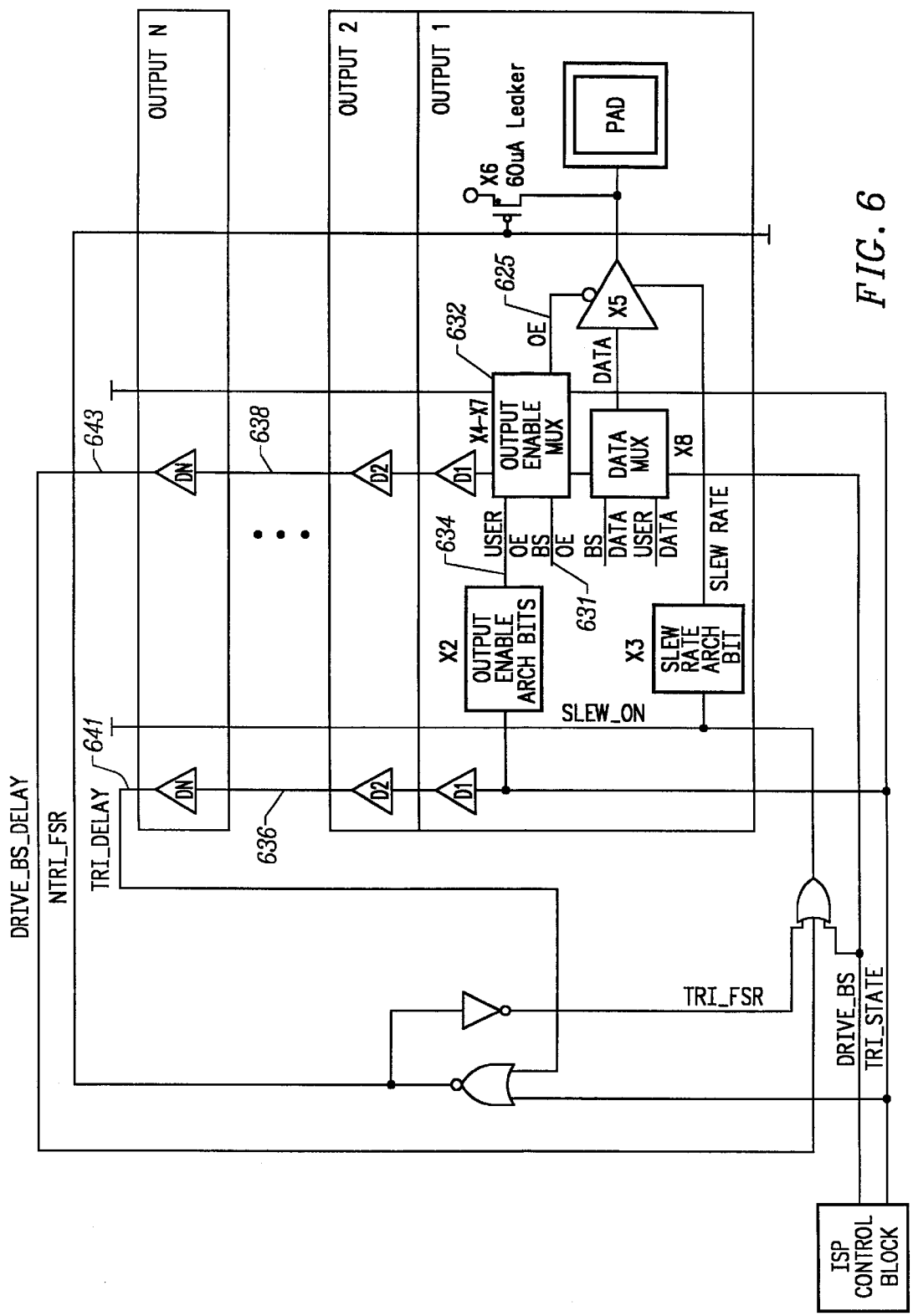
FIG. 6 shows a block diagram of an integrated circuit where in a programming mode, the outputs are placed in a high impedance state or user-defined state.

FIG. 6 shows another circuit diagram for a scheme of reducing output noise when transitioning from the programming mode to the normal mode of operation. This diagram shows the third implementation of the programming mode discussed, where during the programming mode, the outputs of the integrated circuit will be placed in either in tristate or in a state as defined by the user. This circuitry will be compatible with integrated circuits using either the schemes shown in FIG. 2 or 4. As such, the circuit resembles and combines circuitry from both FIGS. 2 and 4. This description will note only the primary differences.

In FIG. 6, during the programming mode, the output enable input 625 of output buffer circuit X5 will be controlled by either a user-defined test value or placed into tristate mode by the output enable control circuit X2. If the output enable state is to be user-defined, the user-defined test output enable input 631 is connected to the output buffer through output enable multiplexer 632. However, if the output enable state will be tristated in a scheme consistent with FIG. 2, then output enable control circuit X2 will define the output state X2 as being tristate, passed through the user output enable input 634.

To reduce output noise when transitioning from the programming or ISP mode to the normal mode, the outputs are sequentially released to their normal mode state in a slow slew rate mode. In this circuitry, there are two delay chain D1 to Dn paths 636 and 638. Path 636 is analogous to the delay chain path for the scheme in FIG. 2, and path 638 is analogous to the delay chain path for the scheme in FIG. 4. These delay chain paths take case of sequential release of the outputs for both the FIG. 2 and FIG. 4 schemes.

Furthermore, path 636 results in a TRI_DELAY signal 641 and path 638 results in a DRIVE_BS_DELAY signal 643. TRI_DELAY drives logic gates to achieve a result similar to that described in FIG. 2 for the TRI_DELAY signal 220. DRIVE_BS_DELAY drives logic gates to achieve a result similar to that described in FIG. 4. Specifically, the slew rate control of the output buffer circuit is released to its user-defined state (i.e., slow or normal) after all the outputs are released to the normal mode.

Figure 7:
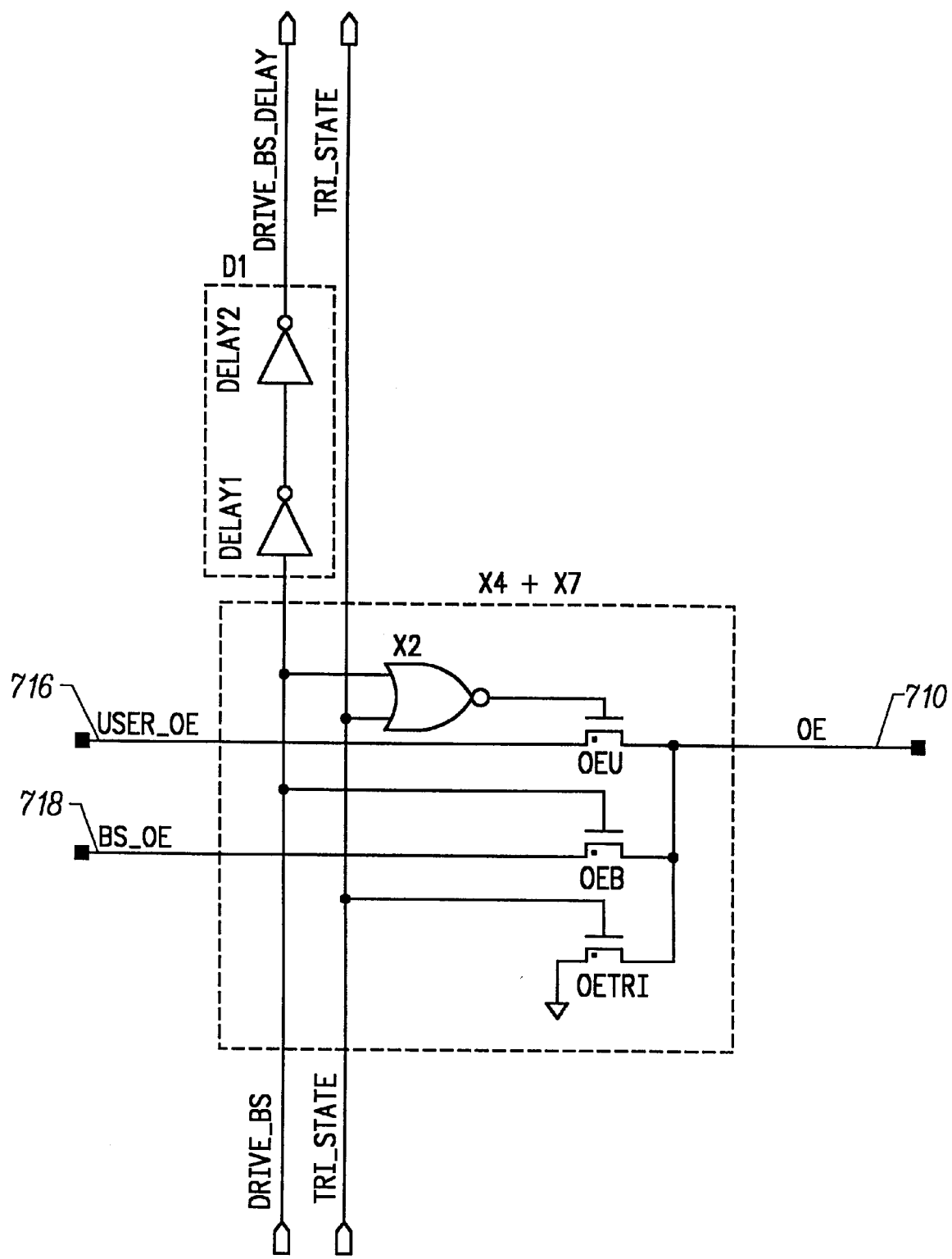
FIG. 7 shows a specific circuit implementation of the integrated circuit of FIG. 6.

FIG. 7 shows an implementation of output enable multiplexer 632. In particular, the output enable signal 710 will be controlled by one of three possible sources, the user output enable input, the user-defined test output enable input, or ground. When TRI_STATE is high, output enable signal 710 will be ground or low. When TRI_STATE is low and DRIVE_BS is high, user-defined test output enable input 718 controls output enable signal 710. When TRI_STATE is low and DRIVE_BS is low, user output enable input 710 controls output enable signal 710.

This detailed description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This detailed description will enable others skilled in the art to best utilize and practice the invention in various embodiments and with various modifications as are suited to the particular use contemplated. It is intended that the scope of the invention be defined by the following claims.

What is claimed is:

1. A method of operating an integrated circuit comprising:
   in a programming mode, placing a plurality of I/O pins of the integrated circuit in a high impedance state;
   maintaining the I/O pins in the high impedance state when exiting the programming mode;
   releasing each I/O pin of the plurality of I/O pins for user mode operation, wherein there is a delay period between the release of one pin of the plurality of I/O pins to a next pin of the plurality of I/O pins; and
   permitting user mode operation after the plurality of I/O pins is released.

2. The method of operating an integrated circuit of claim 1 wherein an output driver driving each I/O pin switches to user mode operation in a slow slew rate mode.

3. The method of operating an integrated circuit of claim 1 wherein in the programming mode, each I/O pin is maintained at a logic high state by a leaker device.

4. The method of operating an integrated circuit of claim 1 wherein in the programming mode, each I/O pin is maintained about at a fixed voltage by a leaker device.

5. The method of operating an integrated circuit of claim 1 further comprising releasing output drivers coupled to the plurality of I/O pins to a user-defined slew rate mode before permitting user mode operation.

6. An integrated circuit comprising:
   a first output circuit to drive a first I/O pin; and
   a second output circuit to drive a second I/O pin;
   a delay element coupled between the first and second output circuit, wherein in exiting a programming mode, the second output circuit is released to its user mode state after the first output circuit is released to its user mode state after a delay time determined by the delay element.

7. The integrated circuit of claim 6 wherein in the programming mode, the first and second output circuits provide a high impedance at the first and second I/O pins.

8. The integrated circuit of claim 6 wherein noise at the first I/O pin and second I/O pin is reduced by releasing the first and second circuits at different times.

9. The integrated circuit of claim 6 wherein the first and second output circuits place the first and second I/O pins in user-defined states.

10. The integrated circuit of claim 9 wherein the user-defined states are logic high, logic low, or high impedance.

11. The integrated circuit of claim 6 wherein the first output circuit comprises:
an output buffer having a user data input and output enable input;
an output enable logic circuit coupled to the output enable input, wherein during a user mode, an output enable state of the output buffer is determined by a user-defined architecture bit.

12. The integrated circuit of claim 11 wherein during the programming mode, the output buffer is placed in a high impedance mode.

13. The integrated circuit of claim 12 wherein during the programming mode, the output buffer is placed in a user-defined output enable state.

14. The integrated circuit of claim 13 wherein the user-defined output enable state is input to the integrated circuit using IEEE standard 1149.9 circuitry.

15. The integrated circuit of claim 6 wherein the first output circuit comprises:
an output buffer with slew rate control; and
a slew rate control circuit to a slew rate control input of the output buffer, wherein during a user mode, a slew rate mode of the output buffer is determined by a user-defined architecture bit.

16. A method of operating an integrated circuit comprising:
in a programming mode, placing a plurality of output pins of the integrated circuit in user-defined states;
maintaining the output pins in their user-defined states when exiting the programming mode;
releasing each output pin of the plurality of output pins for normal mode operation, wherein there is a delay period between the release of one output pin to a next output pin; and
permitting normal mode operation after the plurality of output pins if released.

17. The integrated circuit of claim 16 further comprising:
inputting the user-defined states for the plurality of output pins using IEEE standard 1149.1 circuitry on the integrated circuit.

18. The integrated circuit of claim 16 wherein when exiting the programming mode, output drivers driving the output pins drive the output pins to their normal mode state in a slow slew rate mode.

19. The integrated circuit of claim 16 further comprising:
after releasing the plurality of output pins to their normal mode state, switching output drivers coupled to the output pins to their user-defined slew rate mode.

20. The integrated circuit of claim 19 wherein the user-defined slew rate mode is a slow slew rate mode or normal slew rate mode.

21. An integrated circuit comprising a first output circuit:
an output buffer coupled to a pad, comprising an output enable input and user data input;
an output enable logic circuit coupled to the output enable input and a tristate control signal;
an output enable control circuit comprising an OE output signal coupled to the output enable logic circuit, a multiplexer, and a first architecture bit, wherein the tristate control signal determines whether the output enable logic circuit couples the OE output signal to the output enable input; and
a delay chain circuit comprising a first inverter and a second inverter, wherein an input of the first inverter is coupled to the tristate control signal, and an output of the first inverter is coupled to the output enable control circuit.

22. The integrated circuit of claim 21 further comprising a second output circuit, wherein an output of the second inverter of the delay chain of the first output circuit is coupled to an input of a delay chain of the second output circuit.

23. The integrated circuit of claim 21 wherein the first output circuit further comprises:
a slew rate control circuit coupled to a slew rate input of the output buffer, and the slew rate control circuit comprises a second architecture bit.

24. The integrated circuit of claim 21 wherein the first output circuit further comprises a leaker device coupled between the pad and a fixed voltage level.

25. An integrated circuit comprising a first output circuit comprising:
an output buffer coupled to a pad, comprising an output enable input and output data input;
a first multiplexer coupled to the output enable input, wherein data inputs of the first multiplexer are a user output enable input and a user-defined output enable input, and a first selection input of the first multiplexer is coupled to a mode logic signal;
a second multiplexer coupled to the output data input, wherein data inputs of the second multiplexer are a user data input and a user-defined data input, and a second selection input of the second multiplexer is coupled to the mode logic signal; and
a delay chain circuit coupled to the mode logic signal and outputting a delayed mode logic signal for another output circuit of the integrated circuit.

26. The integrated circuit of claim 25 wherein the delay chain circuit comprises a first inverter and a second inverter.

27. The integrated circuit of claim 25 wherein the first output circuit further comprises:
a slew rate control circuit coupled to a slew rate input of the output buffer, and the slew rate input comprises an architecture bit, wherein the slew rate input determines whether the output buffer transitions from one logic level to another logic level at the pad with a slower edge rate.

28. The integrated circuit of claim 25 wherein in a normal mode, the first multiplexer couples the user output enable input to the output enable input, and the second multiplexer couples the user data input to the output data input.

29. The method of operating an integrated circuit of claim 1 wherein in the programming mode, the integrated circuit is configured with user configuration data while the integrated circuit remains resident in a system.

30. The method of operating an integrated circuit of claim 16 wherein in the programming mode, the integrated circuit is configured with user configuration data while the integrated circuit remains resident in a system.

31. A method of operating an integrated circuit comprising:
in a programming mode, placing a plurality of I/O pins of the integrated circuit in a high impedance state;
maintaining the I/O pins in the high impedance state when exiting the programming mode;
releasing each I/O pin of the plurality of I/O pins for user mode operation, wherein there is a delay period between the release of each output pin; and permitting user mode operation after the plurality of I/O pins is released, wherein an output driver driving each I/O pin switches to user mode operation in a slow slew rate mode.

32. A method of operating an integrated circuit comprising:

in a programming mode, placing a plurality of I/O pins of the integrated circuit in a high impedance state;

maintaining the I/O pins in the high impedance state when exiting the programming mode;

releasing each I/O pin of the plurality of I/O pins for user mode operation, wherein there is a delay period between the release of each output pin; and permitting user mode operation after the plurality of I/O pins is released, wherein in the programming mode, each I/O pin is maintained at a logic high state by a leaker device.

33. A method of operating an integrated circuit comprising:

in a programming mode, placing a plurality of I/O pins of the integrated circuit in a high impedance state;

maintaining the I/O pins in the high impedance state when exiting the programming mode;

releasing each I/O pin of the plurality of I/O pins for user mode operation, wherein there is a delay period between the release of each output pin; and permitting user mode operation after the plurality of I/O pins is released, wherein in the programming mode, each I/O pin is maintained about at a fixed voltage by a leaker device.

34. A method of operating an integrated circuit comprising:

in a programing mode, placing a plurality of output pins of the integrated circuit in user-defined states;

inputting the user-defined states for the plurality of output pins using IEEE standard 1149.1 circuitry on the integrated circuit;

maintaining the output pins in their user-defined states when exiting the programming mode;

releasing each output pin of the plurality of output pins for normal mode operation, wherein there is a delay period between the release of each output pin; and permitting normal mode operation after the plurality of output pins if released.

35. A method of operating an integrated circuit comprising:

in a programming mode, placing a plurality of output pins of the integrated circuit in user-defined states;

maintaining the output pins in their user-defined states when exiting the programming mode;

releasing each output pin of the plurality of output pins for normal mode operation, wherein there is a delay period between the release of each output pin; and permitting normal mode operation after the plurality of output pins if released, wherein when exiting the programming mode, output drivers driving the output pins drive the output pins to their normal mode state in a slow slew rate mode.

36. A method of operating an integrated circuit comprising:

in a programming mode, placing a plurality of output pins of the integrated circuit in user-defined states;

maintaining the output pins in their user-defined states when exiting the programming mode;

releasing each output pin of the plurality of output pins for normal mode operation, wherein there is a delay period between the release of each output pin;

after releasing the plurality of output pins to their normal mode state, switching output drivers coupled to the output pins to their user-defined slew rate mode; and permitting normal mode operation after the plurality of output pins if released.

37. The method of operating an integrated circuit of claim 36 wherein the user-defined slew rate mode is a slow slew rate mode or normal slew rate mode.

38. The method of operating an integrated circuit of claim 31 further comprising releasing output drivers coupled to the plurality of I/O pins to a user-defined slew rate mode before permitting user mode operation.

39. The method of operating an integrated circuit of claim 32 further comprising releasing output drivers coupled to the plurality of I/O pins to a user-defined slew rate mode before permitting user mode operation.

40. The method of operating an integrated circuit of claim 33 further comprising releasing output drivers coupled to the plurality of I/O pins to a user-defined slew rate mode before permitting user mode operation.

41. The method of operating an integrated circuit of claim 31 wherein in the programming mode, the integrated circuit is configured with user configuration data while the integrated circuit remains resident in a system.

42. The method of operating an integrated circuit of claim 32 wherein in the programming mode, the integrated circuit is configured with user configuration data while the integrated circuit remains resident in a system.

43. The method of operating an integrated circuit of claim 33 wherein in the programming mode, the integrated circuit is configured with user configuration data while the integrated circuit remains resident in a system.

44. The method of operating an integrated circuit of claim 34 wherein in the programming mode, the integrated circuit is configured with user configuration data while the integrated circuit remains resident in a system.

45. The method of operating an integrated circuit of claim 35 wherein in the programming mode, the integrated circuit is configured with user configuration data while the integrated circuit remains resident in a system.

46. The method of operating an integrated circuit of claim 36 wherein in the programming mode, the integrated circuit is configured with user configuration data while the integrated circuit remains resident in a system.

* * * * *

UNITED STATES PATENT AND TRADEMARK OFFICE
CERTIFICATE OF CORRECTION

PATENT NO.   : 6,242,941 B1                                            Page 1 of 1
DATED        : June 5, 2001
INVENTOR(S)  : Vest et al.

It is certified that error appears in the above-identified patent and that said Letters Patent is hereby corrected as shown below:

<u>Title page,</u>
Item [75], Inventors, delete "Fremont" and insert therefor -- San Jose --.
Item [56], References Cited, U.S. PATENT DOCUMENTS, add:
-- 5,869,979     2/1999          Bocchino        326/38 --.

<u>Column 13,</u>
Lines 46 and 58, delete "if" and insert therefor -- is --.

<u>Column 14,</u>
Line 17, delete "if" and insert therefor -- is --.

Signed and Sealed this

Twenty-eighth Day of January, 2003

JAMES E. ROGAN
*Director of the United States Patent and Trademark Office*